US012726727B2

(12) United States Patent
Ollila

(10) Patent No.: US 12,726,727 B2
(45) Date of Patent: Sep. 1, 2026

(54) INTERLEAVED COLOUR FILTER ARRAY ON IMAGE SENSOR CHIP

(71) Applicant: Varjo Technologies Oy, Helsinki (FI)

(72) Inventor: Mikko Ollila, Tampere (FI)

(73) Assignee: Varjo Technologies Oy, Helsinki (FI)

( * ) Notice: Subject to any disclaimer, the term of this patent is extended or adjusted under 35 U.S.C. 154(b) by 84 days.

(21) Appl. No.: 18/989,409

(22) Filed: Dec. 20, 2024

(65) Prior Publication Data

US 2025/0221072 A1 Jul. 3, 2025

Related U.S. Application Data

(63) Continuation-in-part of application No. 18/751,526, filed on Jun. 24, 2024, now Pat. No. 12,615,446, and a continuation-in-part of application No. 18/431,148, filed on Feb. 2, 2024, now Pat. No. 12,627,904, and a continuation-in-part of application No. 18/397,188, filed on Dec. 27, 2023.

(51) Int. Cl.
*H04N 25/57* (2023.01)
*H04N 25/13* (2023.01)
*H10F 39/00* (2025.01)

(52) U.S. Cl.
CPC ............ *H04N 25/57* (2023.01); *H04N 25/13* (2023.01); *H10F 39/8033* (2025.01); *H10F 39/8053* (2025.01)

(58) Field of Classification Search
CPC ...... H04N 25/57; H04N 25/13; H04N 25/585; H04N 25/134; H10F 39/8033; H10F 39/8053
See application file for complete search history.

(56) References Cited

U.S. PATENT DOCUMENTS 6,137,100 A * 10/2000 Fossum ................ H04N 25/134 348/277
6,885,398 B1 * 4/2005 Sladen .................. H04N 25/11 348/E9.01

(Continued)

FOREIGN PATENT DOCUMENTS

JP 2014164231 A 9/2014

OTHER PUBLICATIONS

European Patent Office, Extended European Search Report, Application No. 24215720.4, Mailed Apr. 16, 2025, 9 pages.

*Primary Examiner* — Chiawei Chen
(74) *Attorney, Agent, or Firm* — Ziegler IP Law Group, LLC.

(57) ABSTRACT

An imaging system includes an image sensor chip with a photo-sensitive surface, photo-sensitive cells; and a colour filter array with physical smallest repeating units (PSRUs), a given PSRU having at least four sub-units, a given sub-unit comprising colour filters of at least three different colours; and at least four other colour filters whose size is equal to a size of the given sub-unit; and processor(s) configured to: obtain first image data corresponding to the at least four sub-units in individual ones of the PSRUs, while obtaining second image data corresponding to the at least four other colour filters in the individual ones of the PSRUs; and generate at least one of: a first-resolution image, a second-resolution image, a third-resolution image, a high-dynamic range (HDR) image.

15 Claims, 5 Drawing Sheets

(56) References Cited

U.S. PATENT DOCUMENTS 7,821,553 B2 * 10/2010 Ellis-Monaghan .......... H04N 25/135 348/277
10,666,881 B2 * 5/2020 Kaneko ................ H04N 25/575
11,252,360 B2 * 2/2022 Yokogawa .......... H10F 39/8063
2010/0091124 A1 * 4/2010 Hablutzel ............ H04N 25/134 348/E5.031
2011/0101205 A1 * 5/2011 Tian ..................... H04N 25/131 250/208.1
2011/0140182 A1 * 6/2011 Tanaka .................. H10F 39/182 257/292
2014/0078366 A1 * 3/2014 Dokoutchaev ....... H04N 25/133 348/302
2014/0233634 A1 * 8/2014 Alshina ................ H04N 19/503 375/240.02
2015/0288901 A1 * 10/2015 Tanaka ................ H10F 39/1825 250/208.1
2016/0181304 A1 * 6/2016 Ishiwata ................ H04N 25/78 257/432
2017/0018216 A1 * 1/2017 Han ....................... G02B 5/201
2017/0111598 A1 * 4/2017 Tian ..................... H04N 25/134
2018/0302597 A1 10/2018 Honda et al.
2019/0123075 A1 * 4/2019 Morestin ............. H10F 39/8027
2020/0195857 A1 * 6/2020 Sekine ................. H04N 25/583
2020/0350353 A1 11/2020 Kurita et al.
2021/0080630 A1 * 3/2021 Hsu ........................ G02B 5/201
2021/0266425 A1 8/2021 Nakata et al.
2021/0392279 A1 * 12/2021 Numata ................. H04N 25/46
2022/0038648 A1 * 2/2022 Iida ....................... H10F 39/182
2022/0085119 A1 * 3/2022 Huang ................... H10K 59/38
2022/0329747 A1 * 10/2022 Cho ..................... G02B 3/0043
2024/0089619 A1 * 3/2024 Yamashita ............. H04N 25/59
2025/0024164 A1 * 1/2025 Choi .................... H04N 25/134

* cited by examiner

402

404

INTERLEAVED COLOUR FILTER ARRAY ON IMAGE SENSOR CHIP

CROSS-REFERENCE TO RELATED APPLICATIONS

This application is a continuation-in-part of U.S. patent application Ser. No. 18/397,188, titled "HIGH-DYNAMIC RANGE IMAGING USING PARTIAL POLARISATION MASK" and filed on Dec. 27, 2023, U.S. patent application Ser. No. 18/431,148, titled "SIMULTANEOUS SUBSAMPLING AND HIGH DYNAMIC RANGE IMAGING IN COLOUR FILTER ARRAYS" and filed on Feb. 2, 2024, and U.S. patent application Ser. No. 18/751,526, titled "HALLUCINATING COLOUR FILTER ARRAY ON IMAGE SENSOR CHIP" and filed on Jun. 24, 2024, which are incorporated herein by reference.

TECHNICAL FIELD

The present disclosure relates to imaging systems incorporating interleaved colour filter array (CFA) on image sensor chips. The present disclosure also relates to methods incorporating interleaved CFA on image sensor chips.

BACKGROUND

Nowadays, with an increase in the number of images being captured every day, there is an increased demand for developments in image processing. Such a demand is quite high and critical in case of evolving technologies such as immersive extended-reality (XR) technologies which are being employed in various fields such as entertainment, real estate, training, design, medical imaging operations, simulators, navigation, and the like. Several advancements are being made to develop image generation technology.

However, existing image generation technology has several limitations associated therewith. Firstly, some existing image generation technology requires multiple image sensors for capturing images of different resolutions. This increases hardware costs, as additional image sensors need to be procured and integrated. It also adds to design complexity, requiring precise alignment and calibration during assembly. Furthermore, a use of the multiple sensors results in a high power consumption, and increases an overall size and a weight of a device comprising such multiple image sensors, making it less suitable for compact or light-weight applications.

Secondly, other existing image generation technologies require at least two images captured at different exposure settings for generating a high-dynamic range (HDR) image. However, this requires considerable processing resources, involves a long processing time, and requires high computing power. Moreover, the existing image generation technology is not well-suited for generating HDR images along with fulfilling other requirements in XR devices, for example, such as small pixel size and high frame-rate requirements. Resultantly, generated images lack high visual quality, are often generated with considerable latency/delay, thereby leading to a poor, non-immersive viewing experience for a user.

Thirdly, other existing image generation technologies are inefficient in terms of generating different regions of an image at different resolutions at a high frame rate which, for example, is required when using the XR devices. In an example, a gaze region of the image demands a high resolution and a wide dynamic range to capture fine details and enhance a realism of XR experience. In contrast, a peripheral region of the image demands a low resolution since the human eye is less sensitive to details in the peripheral region, but maintaining a low noise is still important to avoid visual distractions. Additionally, a need for colour accuracy may differ based on a direction of vision, as precise colour rendering is more critical in the gaze region as compared to the peripheral region.

Therefore, in light of the foregoing discussion, there exists a need to overcome the aforementioned drawbacks.

SUMMARY

The present disclosure seeks to provide an imaging system and a method which realistically and reliably generate at least one of: a first-resolution image, a second-resolution image, a third-resolution image, a high-dynamic range (HDR) image, using a same image sensor chip, in a computationally-efficient and time-efficient manner. The aim of the present disclosure is achieved by an imaging system and a method which incorporate an interleaved colour filter array (CFA) on an image sensor chip, wherein said interleaved CFA comprises differently-sized colour filters that allow for generating images of various resolutions, as per requirement, as defined in the appended independent claims to which reference is made to. Advantageous features are set out in the appended dependent claims.

Throughout the description and claims of this specification, the words "comprise", "include", "have", and "contain" and variations of these words, for example "comprising" and "comprises", mean "including but not limited to", and do not exclude other components, items, integers or steps not explicitly disclosed also to be present. Moreover, the singular encompasses the plural unless the context otherwise requires. In particular, where the indefinite article is used, the specification is to be understood as contemplating plurality as well as singularity, unless the context requires otherwise.

BRIEF DESCRIPTION OF THE DRAWINGS

FIG. 1A illustrates a simplified example implementation of an imaging system incorporating an interleaved colour filter array (CFA) on an image sensor chip, while

DETAILED DESCRIPTION OF EMBODIMENTS

Figure 1A:
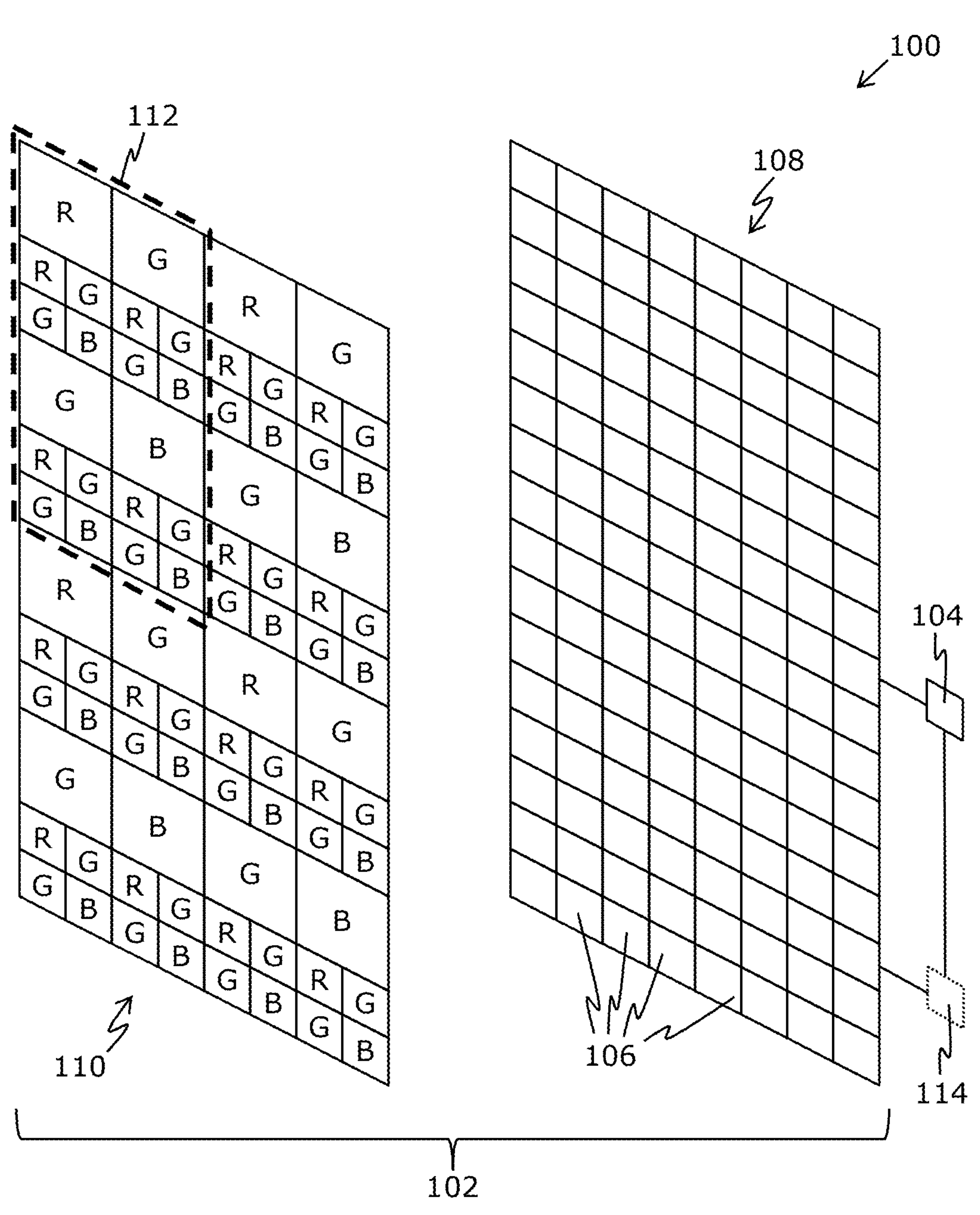

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In a first aspect, an embodiment of the present disclosure provides an imaging system comprising:

an image sensor chip comprising:

a photo-sensitive surface comprising a plurality of photo-sensitive cells; and a colour filter array arranged on an optical path of the photo-sensitive surface, the colour filter array comprising a plurality of physical smallest repeating units, wherein a given physical smallest repeating unit comprises:

at least four sub-units, a given sub-unit comprising colour filters of at least three different colours; and at least four other colour filters whose size is equal to a size of the given sub-unit, at least three of the at least four other colour filters having different colours;

at least one processor configured to:

obtain first image data read out from photo-sensitive cells corresponding to the at least four sub-units in individual ones of the plurality of physical smallest repeating units, whilst obtaining second image data read out from photo-sensitive cells corresponding to the at least four other colour filters in the individual ones of the plurality of physical smallest repeating units; and process at least one of: the first image data, the second image data to generate at least one of: (i) a first-resolution image having a pixel size that is equal to a first size of an individual one of the colour filters in the given sub-unit, (ii) a second-resolution image having a pixel size that is equal to a second size of an individual one of the at least four other colour filters, (iii) a third-resolution image having a pixel size that is different from the first size and the second size, (iv) a high-dynamic range (HDR) image.

In a second aspect, an embodiment of the present disclosure provides a method comprising:

obtaining first image data and second image data read out from an image sensor chip, wherein the image sensor chip comprises: a photo-sensitive surface comprising a plurality of photo-sensitive cells; and a colour filter array arranged on an optical path of the photo-sensitive surface, the colour filter array comprising a plurality of physical smallest repeating units, wherein a given physical smallest repeating unit comprises: at least four sub-units, a given sub-unit comprising colour filters of at least three different colours; and at least four other colour filters whose size is equal to a size of the given sub-unit, at least three of the at least four other colour filters having different colours, wherein the first image data is read out from photo-sensitive cells corresponding to the at least four sub-units in individual ones of the plurality of physical smallest repeating units, whilst the second image data is read out from photo-sensitive cells corresponding to the at least four other colour filters in the individual ones of the plurality of physical smallest repeating units; and processing at least one of: the first image data, the second image data to generate at least one of: (i) a first-resolution image having a pixel size that is equal to a first size of an individual one of the colour filters in the given sub-unit, (ii) a second-resolution image having a pixel size that is equal to a second size of an individual one of the at least four other colour filters, (iii) a third-resolution image having a pixel size that is different from the first size and the second size, (iv) a high-dynamic range (HDR) image.

The present disclosure provides the aforementioned imaging system and the aforementioned method utilising an image sensor chip incorporating an interleaved colour filter array (CFA), to generate the at least one of: (i) the first-resolution image, (ii) the second-resolution image, (iii) the third-resolution image, (iv) the HDR image, in a highly realistic manner, and in a computationally-efficient and time-efficient manner. This is feasible due to presence of colour filters (namely, smaller colour filters) of the at least four sub-units and the at least four other colour filters (namely, larger colour filters) in the given physical smallest repeating unit, as the at least four other colour filters and colour filters of the at least four sub-units have different sizes, and a size of each colour filter directly affects an amount of light captured by at least one corresponding photo-sensitive cell and a level of detail to be represented in a resulting image. Thus, using colour filters of different sizes allows for generating the images at varying resolutions, as per requirement. Photo-sensitive cells corresponding to the larger colour filters capture more light, which can enhance brightness and reduce noise in low-light conditions but may sacrifice some spatial detail due to a lower pixel density in a resulting image. On the other hand, photo-sensitive cells corresponding to the smaller colour filters allow for a higher pixel density in a resulting image, enabling capture of finer details at a higher resolution. Furthermore, the HDR image is also possible to generate (due to a difference in light input as discussed hereinabove). A size of a photo-sensitive cell (namely, a pixel), determined by a silicon area and its fill factor (i.e., a ratio of a light-sensitive area of the photo-sensitive cell to a total area of the photo-sensitive cell), plays a key role in light capture and image quality. Larger photo-sensitive cells, with a higher fill factor, can capture more light, enhancing brightness and reducing noise in low-light conditions, though they may sacrifice some spatial detail due to lower pixel density in the resulting image. In this regard, when the colour filters are large in size, the silicon area beneath these filters can also be considered as large pixels. This is because image data from the silicon area corresponding to each colour filter is read out as a single unit, effectively functioning as a single large pixel. In contrast, smaller photo-sensitive cells enable a higher pixel density, allowing for capturing finer details at higher resolutions. However, they may capture less light per photo-sensitive cell, which can lead to increased noise in low-light conditions. To address this, microlenses are often used to gather and focus more light onto a smaller pixel area, maximising a light sensitivity. While colour filters and microlenses contribute to directing and gathering light, they are designed to complement a pixel layout rather than limit it. Additionally, pixels corresponding differently-sized colour filters within a same image sensor can contribute to a generation of HDR images by capturing varying light levels effectively, enabling both bright and dark areas to be represented with a high dynamic range.

The imaging system and the method are susceptible for generating the aforesaid images along with fulfilling other requirements in extended-reality (XR) devices, for example, such as small pixel size and high frame-rate requirements. The imaging system and the method are simple, robust, fast, reliable, supports real time imaging using an interleaved CFA, and can be implemented with ease.

Throughout the present disclosure, the term "image sensor chip" refers to a semiconductor chip comprising an image sensor. It will be appreciated that the image sensor chip may, for example, be made up of a silicon material. Herein, the term "image sensor" refers to a device that detects light from a real-world environment at the plurality of photo-sensitive cells (namely, a plurality of pixels) to capture a plurality of image signals. The plurality of image signals are electrical signals pertaining to a real-world scene of the real-world environment. The plurality of image signals constitute given image data of the plurality of photo-sensitive cells. Examples of the image sensor include, but are not limited to, a charge-coupled device (CCD) image sensor, and a complementary metal-oxide-semiconductor (CMOS) image sensor.

Throughout the present disclosure, the term "image data" refers to information pertaining to a given photo-sensitive cell of the image sensor chip, wherein said information comprises one or more of: a colour value of the given photo-sensitive cell, a transparency value of the given photo-sensitive cell, a luminosity value of the given photo-sensitive cell. The colour value could, for example, be Red-Green-Blue (RGB) values, Red-Green-Blue-Alpha (RGB-A) values, Cyan-Magenta-Yellow-Black (CMYK) values, Red-Green-Blue-Depth (RGB-D) values, or similar. It will be appreciated that the plurality of photo-sensitive cells could, for example, be arranged in a rectangular two-dimensional (2D) grid, a polygonal arrangement, a circular arrangement, an elliptical arrangement, a freeform arrangement, or the like, on the photo-sensitive surface. In an example, the image sensor chip may comprise 25 million photo-sensitive cells (namely, 25 megapixels) arranged in the rectangular 2D grid (such as a 5000×5000 grid) on the photo-sensitive surface. Image sensor chips and image sensors are well-known in the art.

Optionally, the image sensor chip is a part of a camera that is employed to capture image(s). Optionally, the camera is implemented as a visible-light camera. Examples of the visible-light camera include, but are not limited to, a Red-Green-Blue (RGB) camera, a Red-Green-Blue-Alpha (RGB-A) camera, a Red-Green-Blue-Depth (RGB-D) camera, an event camera, a Red-Green-Blue-White (RGBW) camera, a Red-Yellow-Yellow-Blue (RYYB) camera, a Red-Green-Green-Blue (RGGB) camera, a Red-Clear-Clear-Blue (RCCB) camera, a Red-Green-Blue-Infrared (RGB-IR) camera, and a monochrome camera. Additionally, optionally, the camera is implemented as a depth camera. Examples of the depth camera include, but are not limited to, a Time-of-Flight (ToF) camera, a light detection and ranging (LIDAR) camera, a Red-Green-Blue-Depth (RGB-D) camera, a laser rangefinder, a stereo camera, a plenoptic camera, an infrared (IR) camera, a ranging camera, a Sound Navigation and Ranging (SONAR) camera. Optionally, the camera is implemented as a combination of the visible-light camera and the depth camera.

Throughout the present disclosure, the term "colour filter array" refers to a physical pattern of colour filters arranged in front of the plurality of photo-sensitive cells of the photo-sensitive surface, wherein the colour filter array (CFA) allows only specific wavelengths of light to pass through a given colour filter to reach a corresponding photo-sensitive cell of the photo-sensitive surface, for capturing corresponding image data. CFAs are well-known in the art. Notably, the given physical smallest repeating unit of the CFA is a smallest grid of colour filters that is repeated throughout the CFA. In other words, the given physical smallest repeating unit may be understood as a building block that gets repeated (for example, horizontally and/or vertically) to form an entirety of the CFA.

Throughout the present disclosure, the term "sub-unit" of the given physical smallest repeating unit refers to a smaller grid of colour filters within the given smallest repeating unit. Notably, the given sub-unit from amongst the at least four sub-units comprises the colour filters of the at least three different colours. In some implementations, the colour filters comprise at least one blue colour filter, at least one green colour filter, and at least one red colour filter. In some examples, the colour filters may comprise at least two green colour filters. Optionally, in this regard, the colour filters of the at least three different colours in the given sub-unit comprises colour filters similar to a Bayer CFA. The Bayer CFA could be one of: a standard Bayer CFA, a 4C Bayer CFA (also referred to as "quad" or "tetra", wherein a group of 2×2 pixels has a same colour filter), a 9C Bayer CFA (also referred to as "nona", wherein a group of 3×3 pixels has a same colour filter), a 16C Bayer CFA (also referred to as "hexadeca", wherein a group of 4×4 pixels has a same colour filter). Alternatively, optionally, the colour filters of the at least three different colours in the given sub-unit comprise colour filters similar to a non-Bayer CFA. In other implementations, the colour filters of the at least three different colours comprise at least one cyan colour filter, at least one magenta colour filter, and at least one yellow colour filter. In some examples, the at least one magenta colour filter may comprise at least two magenta colour filters. In yet other implementations, the colour filters of the at least three different colours comprise at least one red colour filter, at least one yellow colour filter, and at least one blue colour filter. In some examples, the at least one yellow colour filter may comprise at least two yellow colour filters.

Optionally, the colour filters of the given sub-unit are arranged in as an N×N array, wherein N is equal to 2 or 3. As an example, the given sub-unit may comprise four colour filters, namely, a red colour filter, two green colour filters, and one blue colour filter. These four colour filters are similar to a standard Bayer CFA, and can be arranged in as an 2×2 array, for example, such as in form an RGrGbB layout, a GrRBGb layout, a GbBRGr layout, or a BGbGrR layout. As another example, the given sub-unit may comprise nine colour filters, namely, two red colour filters, five green colour filters, and two blue colour filters. These nine colour filters can be arranged in as an 3×3 array.

Notably, the given physical smallest repeating unit comprises the at least four other colour filters. It is to be noted that a size of a given other colour filter (from amongst the at least four other colour filters) is equal to the size of the given sub-unit. For example, the size of the given other colour filter may be (approximately) equal to a size of the given sub-unit comprising four colour filters that are arranged in a 2×2 array. Herein, the term "equal" encompasses a size difference not greater than 5 percent between the size of the given other colour filter and the size of the given sub-unit. In some implementations, the at least four other colour filters comprise at least one red colour filter, at least two green colour filters, and at least one blue colour filter. In such implementations, the at least four other colour filters comprises colour filters similar to the Bayer CFA. In other implementations, the at least four other colour filters comprises at least one red colour filter, at least two yellow colour filters, and at least one blue colour filter. In yet other implementations, the at least four other colour filters comprises at least one cyan colour filter, at least two magenta colour filters, and at least one yellow colour filter. It will be appreciated that in the given physical smallest repeating unit, an order or a layout of colour filters in the at least four sub-units could be different from an order or a layout of the at least four other colour filters. For example, each of the at least four sub-units may correspond to an RGGB-based colour pattern, but the at least four other colour filters may collectively correspond to a GRBG-based colour pattern.

In some implementations, the given sub-unit comprises four colour filters arranged in a 2×2 array, and the at least four other colour filters comprises four other colour filters. In such implementations, a given colour filter in the given sub-unit may be arranged on an optical path of a corresponding photo-sensitive cell on the photo-sensitive surface, while a given other colour filter from amongst the four other colour filters is arranged on an optical path of four corresponding photo-sensitive cells (arranged in a 2×2 array) on the photo-sensitive surface. This has been also illustrated in conjunction with FIGS. 1A and 1B, for better understanding and clarity.

A technical benefit of employing colour filters of the at least four sub-units and the at least four other colour filters in the given physical smallest repeating unit is that it allows for generating images of different resolutions as per requirement. This is because the at least four other colour filters and colour filters of the at least four sub-units have different sizes, and a size of each colour filter directly affects an amount of light captured by at least one corresponding photo-sensitive cell and a level of detail to be represented in a resulting image. Thus, photo-sensitive cells corresponding to colour filters of different sizes allows for generating the images at varying resolutions. In other words, larger colour filters capture more light, which can enhance brightness and reduce noise in low-light conditions but may sacrifice some spatial detail due to a lower pixel density in a resulting image. On the other hand, smaller colour filters allow for a higher pixel density in a resulting image, enabling capture of finer details at a higher resolution. Furthermore, employing the colour filters of the at least four sub-units and the at least four other colour filters in the given physical smallest repeating unit also allow for generating HDR images, due to a difference in light input due to a considerable difference between sizes the colour filters of the at least four sub-units and the at least four other colour filters. In other words, a variation in sizes of the colour filters allows the larger colour filters to capture more light and the smaller colour filters to capture less light. Such a difference in the light input enables in capturing visual details in both bright areas and dark areas of a real-world scene simultaneously, which is essential for generating the HDR images. Moreover, a combination of differently-sized colour filters facilitates improved colour reproduction by capturing a broader range of light intensities and colour variations. For example, the larger colour filters enhance sensitivity to subtle colour tones in low-light conditions, while smaller colour filters preserve detailed colour information in well-illuminated areas in the real-world scene. Such a combination of the differently-sized colour filters improves an overall colour accuracy and visual fidelity in the resulting images. For sake of convenience and better understanding only, the colour filters of the at least four sub-units are sometimes referred to as "smaller colour filters", while the at least four other colour filters are sometimes referred to as "larger colour filters".

It will be appreciated that an arrangement of the at least four sub-units and the at least four other colour filters could be performed in several different ways in the given physical smallest repeating unit, which will be described later. There will now be described how image data is read out from the plurality of photo-sensitive cells, and how it is processed for generating the images of different resolutions.

The at least one processor controls an overall operation of the imaging system. The at least one processor is communicably coupled to at least the image sensor chip (specifically, to the plurality of photo-sensitive cells). Optionally, the at least one processor is implemented as an image signal processor. In an example, the image signal processor may be a programmable digital signal processor (DSP). Alternatively, optionally, the at least one processor is implemented as a cloud server (namely, a remote server) that provides a cloud computing service.

Notably, the first image data and the second image data are obtained by the at least one processor simultaneously. The first image data is read out from those photo-sensitive cells which correspond to the at least four sub-units (namely, the smaller colour filters). Simultaneously, the second image data is read out from those photo-sensitive cells which correspond to the at least four other colour filters (namely, the larger colour filters).

In some implementations, given image data is obtained as RAW image data. Herein, the term "given image data" encompasses the first image data and/or the second image data. In some implementations, the given image data may be read out by the at least one processor itself.

It will be appreciated that since both the first image data (corresponding to the smaller colour filters) and the second image data (corresponding to the larger colour filters) are available, it is feasible for the at least one processor to accurately and realistically generate the at least one of: (i) the first-resolution image, (ii) the second-resolution image, (iii) the third-resolution image, (iv) the HDR image, upon processing the at least one of: the first image data, the second image data. In some cases, only one of the first image data and the second image data is processed. The term "first-resolution image" refers to an image having a pixel size that is equal to a size of a smaller colour filter (namely, the first size). The term "second-resolution image" refers to an image having a pixel size that is equal to a size of a larger colour filter (namely, the second size). Thus, the first-resolution image can be understood to be a high-resolution image, while the second-resolution image can be understood to be a low-resolution image. In an example, a resolution of the second-resolution image may be one-fourth of a resolution of the first-resolution image.

The term "third-resolution image" refers to an image having a pixel size that is either greater than or smaller than a size of a larger colour filter, or greater than or smaller than a size of a smaller colour filter. In this regard, in some cases, a resolution (for example, in terms of pixel per degree (PPD)) of the third-resolution image is lesser than both a resolution of the first-resolution image and a resolution of the second-resolution image. In other cases, a resolution of the third-resolution image is greater than a resolution of the second-resolution image, but is lesser than a resolution of the first-resolution image. In yet other cases, a resolution of the third-resolution image is greater than both a resolution of the first-resolution image and a resolution of the second-resolution image. At least one of: the first-resolution image, the second-resolution image, the third-resolution image, could be a colour image or a monochrome image. The term "high-dynamic range image" refers to an image having HDR characteristics. The HDR image represents a real-world scene being captured using a broad range of brightness levels, as compared to a standard image. This facilitates in an improved, accurate representation of a dynamic range of colours in the real-world scene, thereby providing an enhanced contrast and a high visual detail in the HDR image. The HDR image is well-known in the art.

In an example, the first-resolution image could be generated by utilising the first image data (i.e., image data corresponding to the smaller colour filters), and additionally, optionally, by utilising the second image data (i.e., image data corresponding to the larger colour filters). In another example, the second-resolution image could be generated by utilising the second image data (i.e., the image data corresponding to the larger colour filters), and additionally, optionally, by utilising the first image data (i.e., the image data corresponding to the smaller colour filters). Preferably, when generating the second-resolution image, only the second image data is utilised because a low-resolution image is to be generated. In yet another example, the third-resolution image could be generated by utilising the first image data and the second image data. In still another example, the HDR image could be generated by utilising the first image data and the second image data. This is because for the first image data, those photo-sensitive cells that correspond to the smaller colour filters can be understood to be read out using a first setting (due to a decreased light input), whereas for the second image data, those photo-sensitive cells that correspond to the larger colour filters can be understood to be read out using a second setting (due to an increased light input), wherein the first setting and the second setting are two different settings that may pertain to at least one of: an exposure time, a sensitivity, an aperture size. Beneficially, this facilitates in generating the HDR image (as discussed later in detail). It will be appreciated that different sensitivities could be obtained by the camera by changing (namely, altering) analog gain and/or digital gain of the camera. Techniques and algorithms for changing the analog gain and/or the digital gain of the camera (in image signal processing) are well-known in the art.

Optionally, the at least one of: (i) the first-resolution image, (ii) the second-resolution image, (iii) the third-resolution image, (iv) the HDR image, could, for example, be displayed to a user of a client device. Moreover, at least one of the aforesaid image may further be processed to generate an extended-reality (XR) image, to be shown to said user. The client device may be implemented, for example, as a head-mounted display (HMD) device. The term "head-mounted display" device refers to specialized equipment that is configured to present an XR environment to a user when said HMD device, in operation, is worn by the user on his/her head. The HMD device is implemented, for example, as an XR headset, a pair of XR glasses, and the like, that is operable to display a visual scene of the XR environment to the user. The term "extended-reality" encompasses augmented reality (AR), mixed reality (MR), and the like.

There will now be described some exemplary arrangements of the at least four sub-units and the at least four other colour filters in the given physical smallest repeating unit.

In an embodiment, in the given physical smallest repeating unit, the at least four sub-units are arranged in at least two first lines having two sub-units each, while the at least four other colour filters are arranged in at least two second lines having two other colour filters each, wherein a colour of at least one other colour filter in one of the at least two second lines is different from colours of other colour filters in another of the at least two second lines. In some implementations, in the given physical smallest repeating unit, an entirety of the at least two first lines are between the at least two second lines. In other words, smaller colour filters in an entirety of the at least four sub-units are arranged in between the at least four other colour filters (namely, the larger colour filters). A technical benefit of such an arrangement is that it facilitates in generating the first-resolution image in a highly accurate and realistic manner. This is likely because a distance between the at least four sub-units of the given physical smallest repeating unit and at least four sub-units of a next given physical smallest repeating unit is considerably lesser, as compared to a distance between the at least two second lines in the given physical smallest repeating unit. In such a case, a resolution of interpolated image data (namely, hallucinated image data) belonging to pixels corresponding to the distance between the at least four sub-units of the given physical smallest repeating unit and the at least four sub-units of the next given physical smallest repeating unit would be higher, as interpolation can be performed more accurately and realistically due to a lesser distance. Thus, the first-resolution image has a significantly higher resolution, as compared to the second-resolution image. Such an arrangement has been also illustrated in conjunction with FIG. 2A, for better understanding and clarity. Interpolation has been discussed later in detail.

It will be appreciated that when the colour of the at least one other colour filter in the one of the at least two second lines is different from the colours of the other colour filters in the another of the at least two second lines, the at least one two second lines can be said to have colour filters of at least three different colours. It will also be appreciated that the term "line" encompasses a row or a column.

In other implementations, the at least two first lines alternate with the at least two second lines. In this regard, the at least two first lines having two sub-units each and the at least two second lines having two other colour filters each are arranged in an interleaving manner. For example, in the given physical smallest repeating unit, odd rows or odd columns have two other colour filters each, while even rows or even columns have two sub-units each. Such an arrangement has been also illustrated in conjunction with FIG. 1B, for better understanding and clarity. A technical benefit of such an arrangement is that it facilitates in generating the first-resolution image and/or the second-resolution image in an accurate and realistic manner.

In yet other implementations, in the given physical smallest repeating unit, an entirety of the at least two first lines is adjacent to an entirety of the at least two second lines in a horizontal direction or in a vertical direction. One example of such an arrangement has been also illustrated in conjunction with FIG. 2C, for better understanding and clarity.

In an alternative embodiment, in the given physical smallest repeating unit, the at least four sub-units alternate with the at least four other colour filters in a horizontal direction as well as a vertical direction. A technical benefit of such an arrangement is that it allows for generating both the first-resolution image and the second-resolution image in an accurate and realistic manner. This is because locations of the larger colour filters and locations of the smaller colour filters in said arrangement facilitates in performing interpolation in a highly accurate and reliable manner. Such an arrangement has been also illustrated in conjunction with FIG. 2B, for better understanding and clarity.

Optionally, when processing, the at least one processor is configured to perform at least one of:

- interpolation and demosaicking on the first image data, to generate the first-resolution image;
- interpolation and demosaicking on the second image data, to generate the second-resolution image;
- interpolation and demosaicking on at least one of: the first image data, the second image data, to generate the third-resolution image.

In some implementations, the first image data is utilised for generating the first-resolution image, while the second image data may or may not be utilised (namely, taken into account) for generating the first-resolution image. It will be appreciated that since the smaller colour filters are not repeatedly arranged in an entirety of the given physical smallest repeating unit (because it actually has a combination of the smaller colour filters and the larger colour filters), and since the first image data is read out from only those photo-sensitive cells on whose optical path the smaller colour filters are arranged, there would be unread image data corresponding to remaining photo-sensitive cells on whose optical path the smaller colour filters have not been physically arranged. Thus, performing the interpolation on the first image data allows for generating (namely, reconstructing or hallucinating) the unread image data corresponding to such remaining photo-sensitive cells. This is essential for generating the first-resolution image.

Throughout the present disclosure, the term "interpolation" is a specialised process of reconstructing unread image data of some photo-sensitive cells of the photo-sensitive surface by using image data read out from other photo-sensitive cells of the photo-sensitive surface. The interpolation is well-known in the art. The interpolation may sometimes be referred to as hallucination. In traditional image processing, interpolation is typically performed using predefined rules. These rules often involve mathematical operations, such as averaging the values of neighbouring photo-sensitive cells or ensuring a continuity of gradients such as a chromacity or a brightness across an image. A goal of such an interpolation technique is to fill in missing image data in a way that appears natural and maintains an overall image quality. In the context of the present disclosure, however, the term "interpolation" is extended to encompass a neural network-based hallucination. Unlike a traditional interpolation technique, the neural network-based hallucination uses learned models to infer missing image data (such as colour values of unread photo-sensitive cells). Such an approach can produce highly realistic and contextually appropriate reconstructions of missing image data, even when gaps between read out image data are substantial. While the neural network-based hallucination differs fundamentally from the traditional interpolation technique, it serves a similar purpose of reconstructing unread image data.

Optionally, the at least one processor performs the interpolation by employing at least one interpolation algorithm. Optionally, the at least one interpolation algorithm is at least one of: a bilinear interpolation algorithm, an edge-directed weighted-sum interpolation algorithm, a weighted sum interpolation algorithm, a local colour ratio (LCR) algorithm, a median-based interpolation algorithm, an average-based interpolation algorithm, a linear interpolation filtering algorithm, a cubic interpolation filtering algorithm, a four-nearest-neighbours interpolation filtering algorithm, a natural-neighbour interpolation filtering algorithm, a steering kernel regression interpolation filtering algorithm. The aforesaid interpolation algorithms are well-known in the art.

Optionally, upon performing the interpolation, the demosaicking is performed on given image data for generating a set of complete colour values (for example, such as RGB colour values or similar) for each photo-sensitive cell on the photo-sensitive surface. Such a set of complete colour values would be subsequently utilised for generating a given-resolution image. In some cases, the interpolation is performed on the given image data prior to performing the demosaicking. In other cases, the interpolation and the demosaicking are combined as a single operation, for example, when at least one neural network is to be employed (by the at least one processor) for performing the interpolation and the demosaicking. Some aforesaid interpolation algorithms could also be utilised for performing the demosaicking. The demosaicking is well-known in the art.

In other implementations, the second image data is utilised for generating the second-resolution image, while the first image data may or may not be utilised for generating the second-resolution image. It will be appreciated that since the larger colour filters are not repeatedly arranged in an entirety of the given physical smallest repeating unit (because it actually has a combination of the smaller colour filters and the larger colour filters), and since the second image data is read out from only those photo-sensitive cells on whose optical path the larger colour filters are arranged, there would be unread image data corresponding to remaining photo-sensitive cells on whose optical path the larger colour filters have not been physically arranged. Thus, performing the interpolation on the second image data allows for generating the unread image data corresponding to such remaining photo-sensitive cells. This is essential for generating the second-resolution image.

In yet other implementations, the at least one of: the first image data, the second image data is utilised for generating the third-resolution image, depending on a resolution at which the third-resolution image is to be generated. As an example, when the third-resolution image is to be generated at a low resolution, only the second image data is utilised for generating the third-resolution image. As another example, when the third-resolution image is to be generated at a high resolution, either the first image data or both the first image data and the second image data is/are utilised for generating the third-resolution image.

Optionally, the interpolation and the demosaicking on the first image data are performed, based on the second image data. In this regard, both the first image data and the second image data are utilised for generating the first-resolution image. Since the second image data comprises at least colour values of those photo-sensitive cells on whose optical path the larger colour filters are arranged, said colour values could be utilised when performing the interpolation and the demosaicking on the first image data, irrespective of the fact that said colour values correspond to the larger colour filters. A technical benefit of this is that it improves an accuracy of performing the interpolation and the demosaicking (for example, in terms of an improved colour reproduction, a high contrast, a low noise, and the like), thereby generating the first-resolution image in a highly realistic manner (i.e., visual information represented in the first-resolution image would be highly accurate and realistic). It is to be understood that due to the presence of the larger colour filters, said colour values may not be as highly accurate as colour values obtained for photo-sensitive cells on whose optical path the smaller colour filters are arranged, however, said colour values in the second image data could still be beneficially utilised for performing the interpolation and the demosaicking.

Optionally, the interpolation and the demosaicking on the second image data are performed, based on the first image data. In this regard, both the second image data and the first image data are utilised for generating the second-resolution image. Since the first image data comprises colour values of those photo-sensitive cells on whose optical path the smaller colour filters are arranged, said colour values could be utilised when performing the interpolation and the demosaicking on the second image data, irrespective of the fact that said colour values correspond to the smaller colour filters. A technical benefit of this is that it improves an accuracy of performing the interpolation and the demosaicking (for example, in terms of an improved colour reproduction), thereby generating the second-resolution image in a realistic manner (i.e., visual information represented in the second-resolution image would be accurate). It is to be understood that a resolution of the second-resolution image may not be same as a resolution of the first-resolution image, as the first-resolution image primarily corresponds to the smaller colour filters and thus represents finer details and has a higher visual fidelity. However, the generated second-resolution image would still be of a sufficiently-high resolution, and can be presentable to a user.

Optionally, when processing, the at least one processor is configured to perform interpolation and demosaicking on the first image data and the second image data, based on the first size of the individual one of the colour filters in the given sub-unit and the second size of the individual one of the at least four other colours filters, using an HDR imaging technique, to generate the HDR image. In this regard, both the first image data and the second image data are utilised for generating the HDR image. As discussed earlier, those photo-sensitive cells that correspond to the smaller colour filters (namely, the colour filters in the given sub-unit) can be understood to be read out using a first setting. This is because light input of a given photo-sensitive cell amongst said photo-sensitive cells is relatively lesser due to a smaller size of a corresponding colour filter. On the other hand, those photo-sensitive cells that correspond to the larger colour filters (namely, the at least four other colour filters) can be understood to be read out using a second setting. This is because light input of two or more photo-sensitive cells amongst said photo-sensitive cells is relatively higher due to a larger size of a corresponding colour filter. In an example, light input of four pixels that correspond to a larger red colour filter may be four times light input of one pixel that correspond to a smaller red colour filter. The first setting and the second setting are understood to be two different settings that may pertain to at least one of: an exposure time, a sensitivity, an aperture size. For example, the photo-sensitive cells that correspond to the smaller colour filters may be understood to be read out using a reduced aperture size, whereas the photo-sensitive cells that correspond to the larger colour filters may be understood to be read out using a full aperture size. Beneficially, due to this, when processing the first image data and the second image data, the HDR imaging technique is effectively utilised for generating the HDR image. The interpolation and the demosaicking are performed on the first image data and the second image data in a similar manner as described earlier.

Optionally, the HDR imaging technique comprises at least one of: an HDR tone-mapping technique, an HDR exposure bracketing technique, an HDR exposure fusion technique, a dual ISO technique, an edge-preserving filtering technique (for example, such as a guided image filtering technique). The aforesaid HDR imaging techniques and their utilisation for generating HDR images are well-known in the art. The HDR exposure fusion technique is described, for example, in "*Exposure Fusion*" by T. Mertens et al., published in 15th Pacific Conference on Computer Graphics and Applications (PG'07), pp. 382-390, 2007, which has been incorporated herein by reference. The guided image filtering technique is described, for example, in "*Image Fusion with Guided Filtering*" by Shutao Li et al., published in IEEE Transactions on Image Processing, Vol. 22, No. 7, pp. 2864-2875 July 2013, which has been incorporated herein by reference.

Optionally, the first image data and the second image data are read out using at least two different settings pertaining to at least one of: an exposure time, a sensitivity, an aperture size, wherein the first image data and the second image data are processed to generate the HDR image. In this regard, the first image data and the second image data are read out using at least one of: different exposure times, different sensitivities, different aperture sizes. The technical benefit of using the at least two different settings for reading out the first image data and the second image data is that it facilitates in generating HDR images, without negatively affecting a frame rate of generating images. Optionally, when processing the (subsampled) image data that is read out using the at least two different settings, the at least one neural network performs at least one operation on said image data, that provide a result that is similar to applying at least one HDR imaging technique on said image data.

Optionally, the first image data and the second image data are processed using at least one first neural network. Optionally, in this regard, when processing the first image data and the second image data, the at least one processor is configured to use the at least one first neural network for performing interpolation and demosaicking on at least one of: the first image data, the second image data, to generate the at least one of: the at least one of: (i) the first-resolution image, (ii) the second-resolution image, (iii) the third-resolution image, (iv) the HDR image. Optionally, an input of the at least one first neural network comprises the at least one of: the first image data, the second image data. The at least one neural network performs the interpolation and the demosaicking in a highly accurate manner, as compared to conventional techniques. It will be appreciated that the input is provided to the at least one first neural network both in a training phase of the at least one first neural network and in an inference phase of the at least one first neural network (i.e., when the at least one first neural network is utilised after it has been trained). It will also be appreciated that when the at least one first neural network is used, the interpolation and demosaicking (and optionally, the HDR imaging technique) could be combined as a single operation, unlike in the conventional techniques where the demosaicking and the interpolation (and optionally, and the HDR technique) are treated as separate operations and where information pertaining to linear or non-linear relationships between neighbouring photo-sensitive cells is necessary for performing these operations. The interpolation performed using the at least one first neural network can be understood to be inpainting or hallucinating missing/unread image data. In addition to these operations, there could be various image enhancement or image restoration operations (as mentioned hereinbelow) that can be optionally performed using the at least one first neural network. In this way, the at least one first neural network may be trained to generate substantially accurate missing/unread image data, based on available read out image data (namely, the first image data and/or the second image data), to generate at least one of the aforesaid images. These operations can even be performed at different scales, pixel sizes, or levels of detail to enhance an overall visual quality of a given image from amongst the aforesaid images.

It will be appreciated that the at least one first neural network could be used to upscale or process an image so that different parts of the image have a same resolution or to fill in missing data in a way that makes a resolution of the image uniform across its field of view. This could involve "hallucinating" missing details or smoothing out pixel values to create a consistent resolution throughout its field of view.

Then, a conventional method can be used to create an HDR image, for example, after a resolution adjustment of the image, conventional techniques such as a global or local tone mapping technique, an adaptive gamma or contrast enhancement technique, an exposure blending or fusion technique, and the like, would be performed on the image to enhance a dynamic range of the image, ensuring that both bright and dark areas are well-represented in resulting HDR image with a high visual details.

Additionally, optionally, a training process of the at least one first neural network involves utilising a loss function that is generated based on perceptual factors and contextual factors. Such a loss function would be different from a loss function utilised in the conventional techniques. Perceptual loss factors may relate to visual perception of a generated given image. Instead of solely considering pixel-level differences, perceptual loss factors aim to measure a similarity in terms of higher-level visual features of a given image. Contextual loss factors may take into account a relationship and a coherence between neighbouring pixels in the given image. By incorporating the perceptual factors and the contextual factors into the training process, the at least one first neural network can produce a visually-pleasing and contextually-coherent output. It will be appreciated that the loss function of the at least one first neural network could optionally also take into account various image enhancement/restoration operations beyond just the demosaicking and the interpolation; the various image enhancement/restoration operations may, for example, include at least one of: an image deblurring operation, an image contrast enhancement operation, a low-light enhancement operation, an exposure correction operation, a tone mapping operation, a colour conversion operation, a white balancing operation, a super-resolution operation, an image compression operation.

Optionally, the first image data and the second image data are obtained as separate streams. In this regard, the at least one processor obtains the first image data as a first stream via a first virtual channel, whilst obtaining the second image data as a second stream via a second virtual channel. Herein, a given stream is a continuous flow of given image data from the image sensor chip. It will be appreciated that when the first image data and the second image data are obtained as the separate streams, both the first image data and the second image data are read out according to the plurality of physical smallest repeating units only.

The first stream corresponds to those photo-sensitive cells on whose optical path the smaller colour filters are arranged, and the second stream corresponds to those photo-sensitive cells on whose optical path the larger colour filters are arranged. The first stream and the second stream beneficially allow the image sensor chip to separately handle the first image data and the second image data captured by photo-sensitive cells that correspond to differently-sized colour filters. Furthermore, a virtual channel is a logical separation of data within a same physical communication link. It enables the image sensor chip to transmit multiple streams of image data simultaneously without interference, over a shared interface, such as a MIPI Camera Serial Interface and its physical layers interface (commonly used in image sensor chips). Such a separation ensures that the at least one processor can process each stream independently without mixing or confusion.

Optionally, the image sensor chip further comprises a controller configured to employ at least one second neural network during read out of the first image data, wherein the first image data is in a RAW image format, and wherein a smallest repeating unit in a colour pattern of at least a part of the first image data is different from the given physical smallest repeating unit in the colour filter array of the image sensor chip.

Optionally, the image sensor chip further comprises a controller configured to employ at least one second neural network during read out of the second image data, wherein the second image data is in a RAW image format, and wherein a smallest repeating unit in a colour pattern of at least a part of the second image data is different from the given physical smallest repeating unit in the colour filter array of the image sensor chip.

Throughout the present disclosure, the term "controller" refers to a component that is capable of at least employing the at least one second neural network to generate given image data according to a colour pattern, said colour pattern having a smallest repeating unit that is different from the given physical smallest repeating unit of the CFA. Throughout the present disclosure, the term "colour pattern" refers to a digital pattern of colour filters that is to be employed by the at least one second neural network for generating at least a part of the given image data. In other words, the colour pattern is not actually or physically present in the image sensor chip, but is only present in a hallucinated manner (i.e., without its physical presence) for facilitating the at least one second neural network to generate at least said part of the given image data according to said colour pattern. The smallest repeating unit of the colour pattern is a smallest grid of colour filters that is repeated throughout the colour pattern. The smallest repeating unit of the colour pattern may, for example, be an P×Q array of colour filters. It will be appreciated that when the smallest repeating unit is different from the given physical smallest repeating unit, it also encompasses a change/difference in a layout of colour filters. For example, a RGGB Bayer colour pattern may be changed to a GBRG Bayer colour pattern. It will be appreciated that an overall size of the smallest repeating unit in the colour pattern may be lesser, as compared to an overall size of the given physical smallest repeating unit in the CFA. Optionally, the smallest repeating unit in the colour pattern of at least said part of the given image data corresponds to a standard Bayer colour pattern. It will be appreciated that when the given image data is in a RAW image format, the given image data is unprocessed (or may be minimally processed) when generated by the at least one second neural network. The RAW image format is well-known in the art.

In some implementations, a single part of the given image data (which, for example, corresponds to a gaze region in the photo-sensitive surface) is generated according to the colour pattern, while a remaining part of the given image data (which, for example, corresponds to a peripheral region surrounding the gaze region in the photo-sensitive surface) is generated according to the CFA only. In other implementations, an entirety of the given image data is generated according to the colour pattern. In yet other implementations, different parts of the given image data are generated according to one or more colour patterns.

A technical benefit of generating at least said part of the given image data by the at least one second neural network according to the colour pattern is that it facilitates in processing at least said part of the given image data in a time-efficient and computationally-efficient manner, thereby generating high-quality, realistic images at a high framerate with accurate colour reproduction. This is because said colour pattern is well-supported by (namely, is well-compatible or suitable with) image signal processes that are to be performed when processing the given image data, as compared to the CFA. Thus, said image signal processes can be easily and efficiently performed by the at least one processor, without requiring any changes in existing software/firmware algorithms corresponding to said image signal processes, which otherwise would have been required when the given image data is to be generated according to the CFA only. Some examples of said image signal processes may be black level correction, defective pixel correction, Bayer domain denoising, lens shading correction, colour conversion matrix interpolation, autofocus, auto-exposure, gamma correction, aberration correction, reprojection, and the like.

Optionally, the at least one given neural network is any one of: a U-net type neural network, an autoencoder, a pure Convolutional Neural Network (CNN), a Residual Neural Network (ResNet), a Vision Transformer (ViT), a neural network having self-attention layers, a generative adversarial network (GAN), a diffusion-based neural network, a deep-unfolding neural network. Herein, the term "at least one given neural network" encompasses the at least one first neural network and the at least one second neural network.

Optionally, the controller is configured to employ binning when reading out from neighbouring photo-sensitive cells in at least a region of the photo-sensitive surface that correspond to colour filters of a same type. In this regard, the neighbouring photo-sensitive cells (corresponding to the colour filters of the same type (namely, a same colour)) are binned (namely, combined) together to form a single super photo-sensitive cell. Beneficially, this enables in reducing a noise in a corresponding region of a given image (that is generated upon processing the given image data), for example, due to averaging. This may, particularly, be beneficial when said region of the photo-sensitive surface is the peripheral region in the photo-sensitive surface, because the noise is typically more perceivable in a peripheral region of any image, as compared to a gaze region of said image. The aforesaid binning may also facilitate in reducing an overall time of reading out the given image data from the image sensor chip.

The present disclosure also relates to the method as described above. Various embodiments and variants disclosed above, with respect to the aforementioned first aspect, apply mutatis mutandis to the method.

Optionally, in the method, in the given physical smallest repeating unit, the at least four sub-units are arranged in at least two first lines having two sub-units each, while the at least four other colour filters are arranged in at least two second lines having two other colour filters each, wherein a colour of at least one other colour filter in one of the at least two second lines is different from colours of other colour filters in another of the at least two second lines.

Optionally, in the method, the at least two first lines alternate with the at least two second lines.

Optionally, in the method, in the given physical smallest repeating unit, the at least four sub-units alternate with the at least four other colour filters in a horizontal direction as well as a vertical direction.

Optionally, in the method, the colour filters of the given sub-unit are arranged in as an N×N array, wherein N is equal to 2 or 3.

Optionally, in the method, the step of processing comprises performing:

- interpolation and demosaicking on the first image data, to generate the first-resolution image;
- interpolation and demosaicking on the second image data, to generate the second-resolution image;
- interpolation and demosaicking on at least one of: the first image data, the second image data, to generate the third-resolution image.

Optionally, in the method, the interpolation and the demosaicking on the first image data are performed, based on the second image data.

Optionally, in the method, the interpolation and the demosaicking on the second image data are performed, based on the first image data.

Optionally, in the method, the step of processing comprises performing interpolation and demosaicking on the first image data and the second image data, based on the first size of the individual one of the colour filters in the given sub-unit and the second size of the individual one of the at least four other colours filters, using an HDR imaging technique, to generate the HDR image.

Optionally, in the method, the first image data and the second image data are read out using at least two different settings pertaining to at least one of: an exposure time, a sensitivity, an aperture size, wherein the first image data and the second image data are processed to generate the HDR image.

Optionally, in the method, the first image data and the second image data are processed using at least one first neural network.

Optionally, in the method, the first image data and the second image data are obtained as separate streams.

Optionally, in the method, the image sensor chip further comprises a controller configured to employ at least one second neural network during read out of the first image data, wherein the first image data is in a RAW image format, and wherein a smallest repeating unit in a colour pattern of at least a part of the first image data is different from the given physical smallest repeating unit in the colour filter array of the image sensor chip.

Optionally, in the method, the image sensor chip further comprises a controller configured to employ at least one second neural network during read out of the second image data, wherein the second image data is in a RAW image format, and wherein a smallest repeating unit in a colour pattern of at least a part of the second image data is different from the given physical smallest repeating unit in the colour filter array of the image sensor chip.

DETAILED DESCRIPTION OF THE DRAWINGS

Figure 1B:
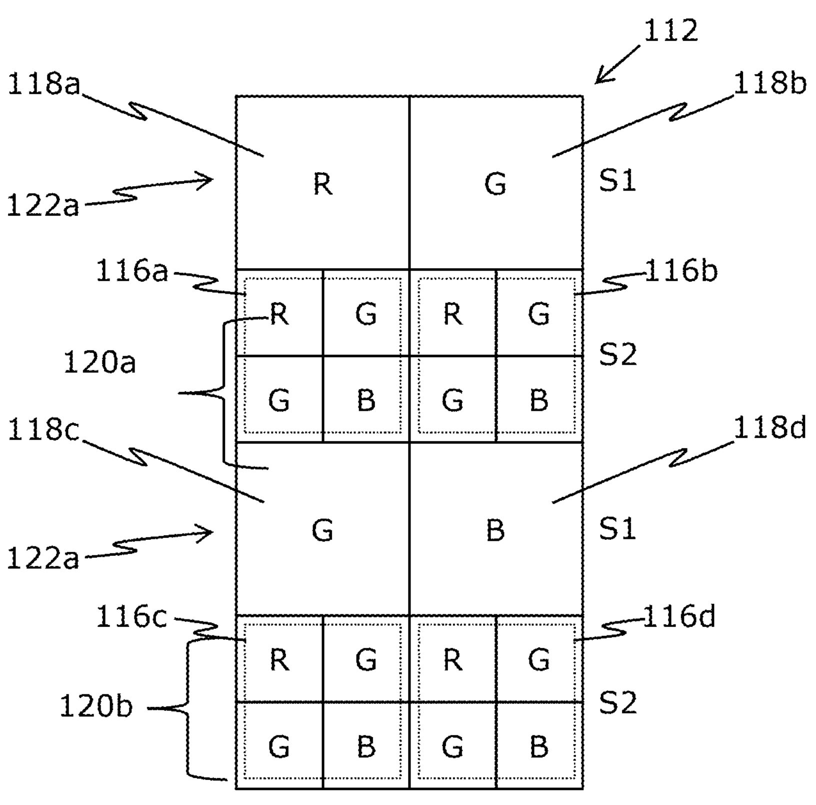
FIG. 1B illustrates a given smallest repeating unit in the CFA of the image sensor chip, in accordance with an embodiment of the present disclosure.

Referring to FIGS. 1A and 1B, FIG. 1A illustrates a simplified example implementation of an imaging system 100 incorporating an interleaved colour filter array (CFA) on an image sensor chip, while FIG. 1B illustrates a given smallest repeating unit in the CFA of the image sensor chip, in accordance with an embodiment of the present disclosure. The simplified example implementation has been shown using an exploded view in FIG. 1A. The imaging system 100 comprises an image sensor chip 102 and at least one processor (depicted as a processor 104). The image sensor chip 102 comprises a plurality of photo-sensitive cells 106 arranged on a photo-sensitive surface 108, and a CFA 110. It will be appreciated that a photo-sensitive surface of a typical image sensor has millions of photo-sensitive cells. The processor 104 is shown to be communicably coupled to the image sensor chip 102 (specifically, to the plurality of photo-sensitive cells 106). For sake of simplicity and clarity, there is shown only a portion of the CFA 110 that corresponds to a portion of the photo-sensitive surface 108. In the shown portion of the CFA 110, "B" refers to blue colour filters, "G" refers to green colour filters, and "R" refers to red colour filters. Said portion of the photo-sensitive surface 108 comprises 128 photo-sensitive cells arranged in an 16×8 (i.e., rows×columns) grid. The shown portion of the CFA

110 is arranged on an optical path of the photo-sensitive surface 108. The CFA 110 comprises a plurality of physical smallest repeating units, wherein a given physical smallest repeating unit 112 (depicted using a dashed line box) is repeated throughout the CFA 110. Optionally, the image sensor chip 102 further comprises a controller 114 that is communicably coupled to the processor 104, wherein the controller 114 is configured to employ at least one given neural network during read out of given image data from the plurality of photo-sensitive cells 106. The processor 104 is configured to perform various operations, as described earlier with respect to the aforementioned first aspect.

For sake of clarity and better understanding, parts of the given physical smallest repeating unit 112 are shown separately in FIG. 1B.

With reference to FIG. 1B, the given physical smallest repeating unit 112 comprises at least four sub-units (for example, depicted as four sub-units 116*a*, 116*b*, 116*c*, and 116*d*), wherein a given sub-unit from amongst the four sub-units 116*a-d* comprises colour filters of at least three different colours; and at least four other colour filters (for example, depicted as four other colour filters 118*a*, 118*b*, 118*c*, and 118*d*) whose size is equal to a size of the given sub-unit, at least three of the four other colour filters 118*a-d* having different colours.

For illustration purposes only, each of the four sub-units 116*a-d* comprises four colour filters, namely, one red colour filter, two green colour filters, and one blue colour filter. Thus, each of the four sub-units 116*a-d* corresponds to a standard Bayer colour pattern, for example, depicted as an RGGB-based colour pattern. The colour filters of the given sub-unit are arranged in a 2×2 array. Furthermore, the other colour filter 118*a* is a red colour filter, the other colour filters 118*b-c* are green colour filters, and the other colour filter 118*d* is a blue colour filter. Thus, the four other colour filters 118-*d* collectively correspond to a standard Bayer colour pattern, for example, depicted as an RGGB-based colour pattern. It will be appreciated that in the given physical smallest repeating unit 112, an order or a layout of colour filters in the four sub-units 116*a-d* could be different from an order or a layout of the four other colour filters 118-*d*. For example, each of the four sub-units 116*a-d* may correspond to an RGGB-based colour pattern, but the four other colour filters 118-*d* may collectively correspond to a GRBG-based colour pattern.

It will be appreciated that red colour filters, green colour filters, and blue colour filters are only shown for clarity and simplicity. The given sub-unit and/or other colour filters can alternatively comprise other types of colour filters, for example, such as cyan colour filters, magenta colour filters, and yellow colour filters.

With reference to FIG. 1B, in the given physical smallest repeating unit 112, the four sub-units 116*a-d* are arranged in two first lines (namely, two first rows) 120*a* and 120*b*, wherein the two first lines 120*a* and 120*b* have two sub-units 116*a-b* and 116*c-d*, respectively. The four other colour filters 118*a-d* are arranged in two second lines (namely, two second rows) 122*a* and 122*b*, wherein the two second lines 122*a* and 122*b* have two colour filters 118*a-b* and 118*c-d*, respectively. As an example, as shown, the two first lines 120*a-b* and the two second lines 122*a-b* are arranged in an alternating (namely, interleaving) manner with respect to each other.

With reference to FIG. 1A, for sake of simplicity and better understanding, each of the four other colour filters 118*a-d* (arranged as shown in FIG. 1B) is arranged on an optical path of four corresponding photo-sensitive cells (for example, being arranged in a 2×2 array) in the photo-sensitive surface 108. Moreover, each colour filter of the given sub-unit is arranged on an optical path of a corresponding photo-sensitive cell in the photo-sensitive surface 108.

With reference to FIGS. 1A and 1B, notably, the processor 104 is configured to obtain first image data that is read out from photo-sensitive cells corresponding to the four sub-units 116*a-d* in individual ones of the plurality of physical smallest repeating units, whilst obtaining second image data that is read out from photo-sensitive cells corresponding to the four other colour filters 118*a-d* in the individual ones of the plurality of physical smallest repeating units. Optionally, in this regard, the first image data is read out using a first setting S1 and the second image data is read out using a second setting S2, wherein the first setting S1 and the second setting S2 are different from each other, and the first setting S1 and the second setting S2 pertain to at least one of: an exposure time, a sensitivity, an aperture size, wherein the first image data and the second image data are processed (for example, by the processor 104) to generate a high-dynamic range (HDR) image.

It may be understood by a person skilled in the art that FIG. 1A includes a simplified example implementation of the imaging system 100, for sake of clarity, which should not unduly limit the scope of the claims herein. It is to be understood that the specific implementation of the imaging system 100 is not to be construed as limiting it to specific numbers or types of image sensor chips, processors, controllers, photo-sensitive cells, colour filters, and colour filter arrays. The person skilled in the art will recognize many variations, alternatives, and modifications of embodiments of the present disclosure.

Figure 2A:
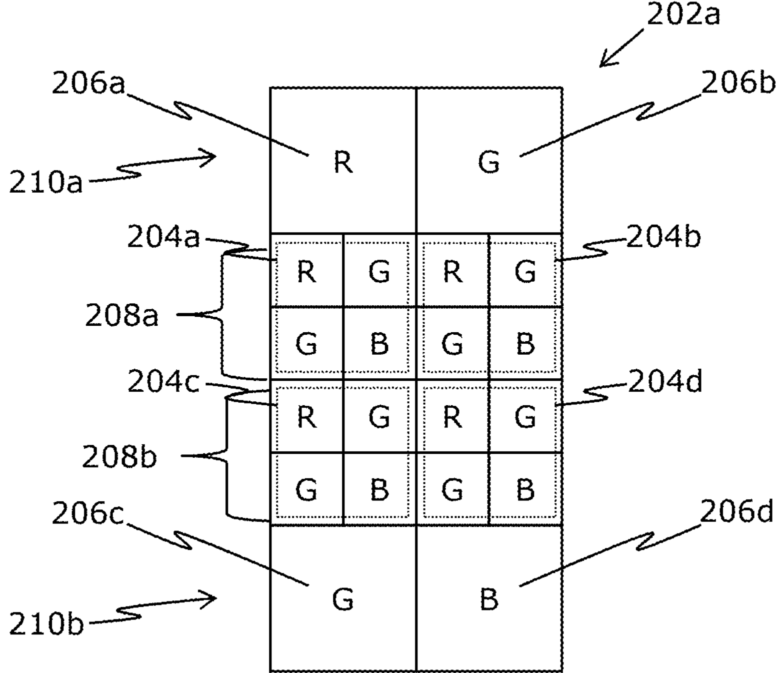
FIGS. 2A, 2B, and 2C illustrate various different examples of a given physical smallest repeating unit in a colour filter array (CFA), in accordance with an embodiment of the present disclosure.
Figure 2B:
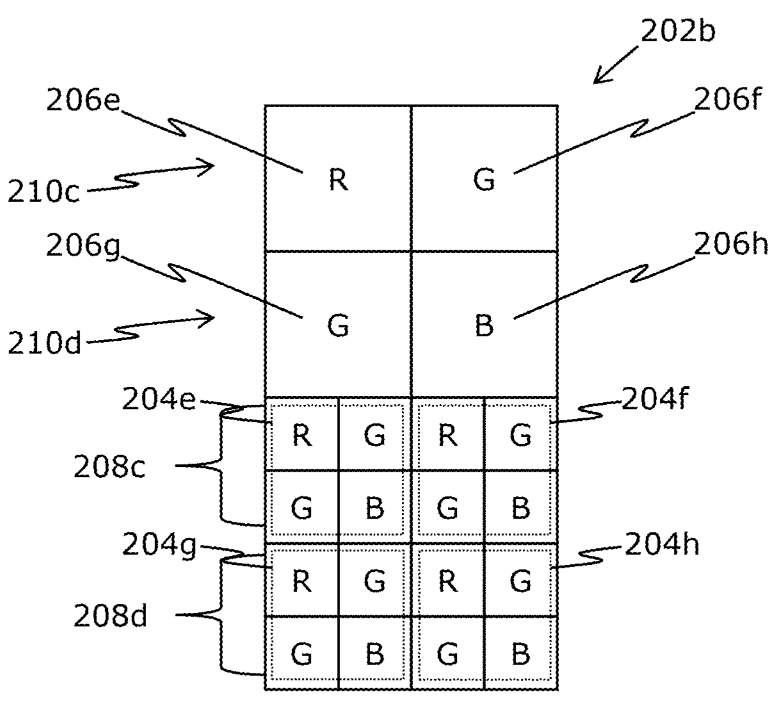
Figure 2C:
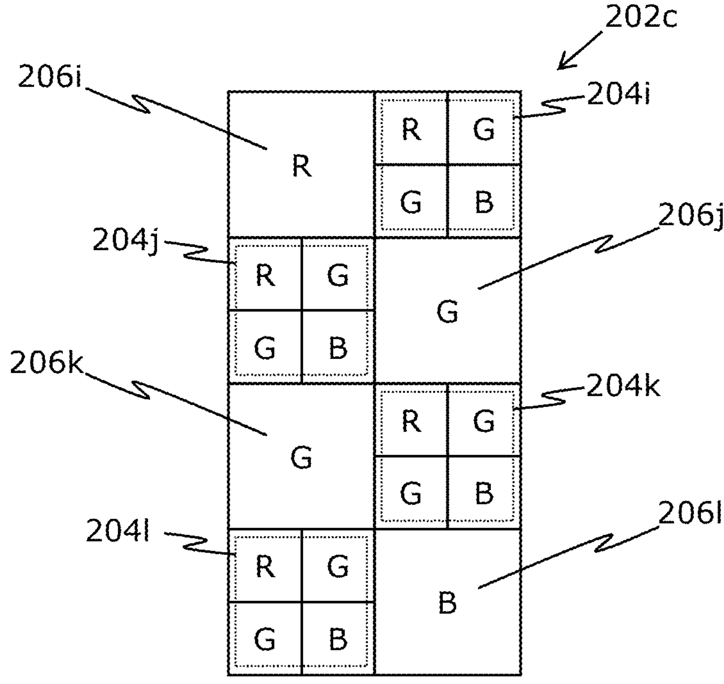

Referring to FIGS. 2A, 2B, and 2C, illustrated are various different examples of a given physical smallest repeating unit 202*a*, 202*b*, 202*c* in a colour filter array (CFA), in accordance with an embodiment of the present disclosure. With reference to FIGS. 2A-2C, "B" refers to blue colour filters, "G" refers to green colour filters, and "R" refers to red colour filters.

With reference to FIG. 2A, the given physical smallest repeating unit 202*a* is shown to comprise four sub-units 204*a*, 204*b*, 204*c*, and 204*d*, and four other colour filters 206*a*, 206*b*, 206*c*, and 206*d*. Each of the four sub-units 204*a-d* comprises four colour filters, namely, one red colour filter, two green colour filters, and one blue colour filter. Thus, each of the four sub-units 204*a-d* corresponds to a standard Bayer colour pattern. The colour filters of the given sub-unit are arranged in a 2×2 array. Furthermore, the other colour filter 206*a* is a red colour filter, the other colour filters 206*b-c* are green colour filters, and the other colour filter 206*d* is a blue colour filter. Thus, the four other colour filters 206*a-d* collectively correspond to a standard Bayer colour pattern.

In the given physical smallest repeating unit 202*a*, the four sub-units 204*a-d* are arranged in two first lines (namely, two first rows) 208*a* and 208*b*, wherein the two first lines 208*a* and 208*b* have two sub-units 204*a-b* and 204*c-d*, respectively. The four other colour filters 206*a-d* are arranged in two second lines (namely, two second rows) 210*a* and 210*b*, wherein the two second lines 210*a* and 210*b* have two other colour filters 206*a-b* and 206*c-d*, respectively. As shown, in the given physical smallest repeating unit 202*a*, both the two first lines 208*a-b* are in between the two second lines 210*a-b*. In other words, smaller colour filters in all the four sub-units 204*a-d* are arranged in between the four other colour filters 206*a-d* (namely, larger colour filters).

With reference to FIG. 2B, the given physical smallest repeating unit 202*b* is shown to comprise four sub-units 204*e*, 204*f*, 204*g*, and 204*h*, and four other colour filters 206*e*, 206*f*, 206*g*, and 206*h*. Each of the four sub-units 204*e-h* comprises four colour filters, namely, one red colour filter, two green colour filters, and one blue colour filter. Thus, each of the four sub-units 204*e-h* corresponds to a standard Bayer colour pattern. The colour filters of the given sub-unit are arranged in a 2×2 array. Furthermore, the other colour filter 206*e* is a red colour filter, the other colour filters 206*f-g* are green colour filters, and the other colour filter 206*h* is a blue colour filter. Thus, the four other colour filters 206*e-h* collectively correspond to a standard Bayer colour pattern.

In the given physical smallest repeating unit 202*b*, the four sub-units 204*e-h* are arranged in two first lines (namely, two first rows) 208*a* and 208*b*, wherein the two first lines 208*c* and 208*d* have two sub-units 204*e-f* and 204*g-h*, respectively. The four other colour filters 206*e-h* are arranged in two second lines (namely, two second rows) 210*c* and 210*d*, wherein the two second lines 210*c* and 210*d* have two other colour filters 206*e-f* and 206*g-h*, respectively. As shown, in the given physical smallest repeating unit 202*b*, both the two first lines 208*c-d* are shown to be adjacent to both the two second lines 210*c-d* in a vertical direction.

With reference to FIG. 2C, the given physical smallest repeating unit 202*c* is shown to comprise four sub-units 204*i*, 204*j*, 204*k*, and 204*l*, and four other colour filters 206*i*, 206*j*, 206*k*, and 206*l*. Each of the four sub-units 204*i-l* comprises four colour filters, namely, one red colour filter, two green colour filters, and one blue colour filter. Thus, each of the four sub-units 204*i-l* corresponds to a standard Bayer colour pattern. The colour filters of the given sub-unit are arranged in a 2×2 array. Furthermore, the other colour filter 206*i* is a red colour filter, the other colour filters 206*j-k* are green colour filters, and the other colour filter 206*l* is a blue colour filter. Thus, the four other colour filters 206*i-l* collectively correspond to a standard Bayer colour pattern. As shown, in the given physical smallest repeating unit 202*c*, the four sub-units 204*i-l* alternate with the four other colour filters 206*i-l* in a horizontal direction as well as a vertical direction.

It will be appreciated that in FIG. 2A-2C, red colour filters, green colour filters, and blue colour filters are only shown for clarity and simplicity. A given sub-unit and/or other colour filters can alternatively comprise other types of colour filters, for example, such as cyan colour filters, magenta colour filters, and yellow colour filters.

Referring to FIGS. 3A, 3B, 3C, and 3D, illustrated are various examples of images generated upon processing first image data and second image data, in accordance with an embodiment of the present disclosure. With reference to FIGS. 3A-3D, "B" refers to blue colour pixels, "G" refers to green colour pixels, and "R" refers to red colour pixels. The first image data is read out from photo-sensitive cells corresponding to smaller colour filters, while the second image data is read out from photo-sensitive cells corresponding to larger colour filters. For sake of simplicity and better understanding only, said images can be understood to be generated by employing the given physical smallest repeating unit 112 as shown in FIG. 1B. In this regard, the smaller colour filters can be understood to be colour filters of the four sub-units 116*a-d* in the given physical smallest repeating unit 112, while the larger colour filters can be understood to be the four other colour filters 118*a-d* in the given physical smallest repeating unit 112, as shown in FIG. 1B.

Figures 3A, 3B:
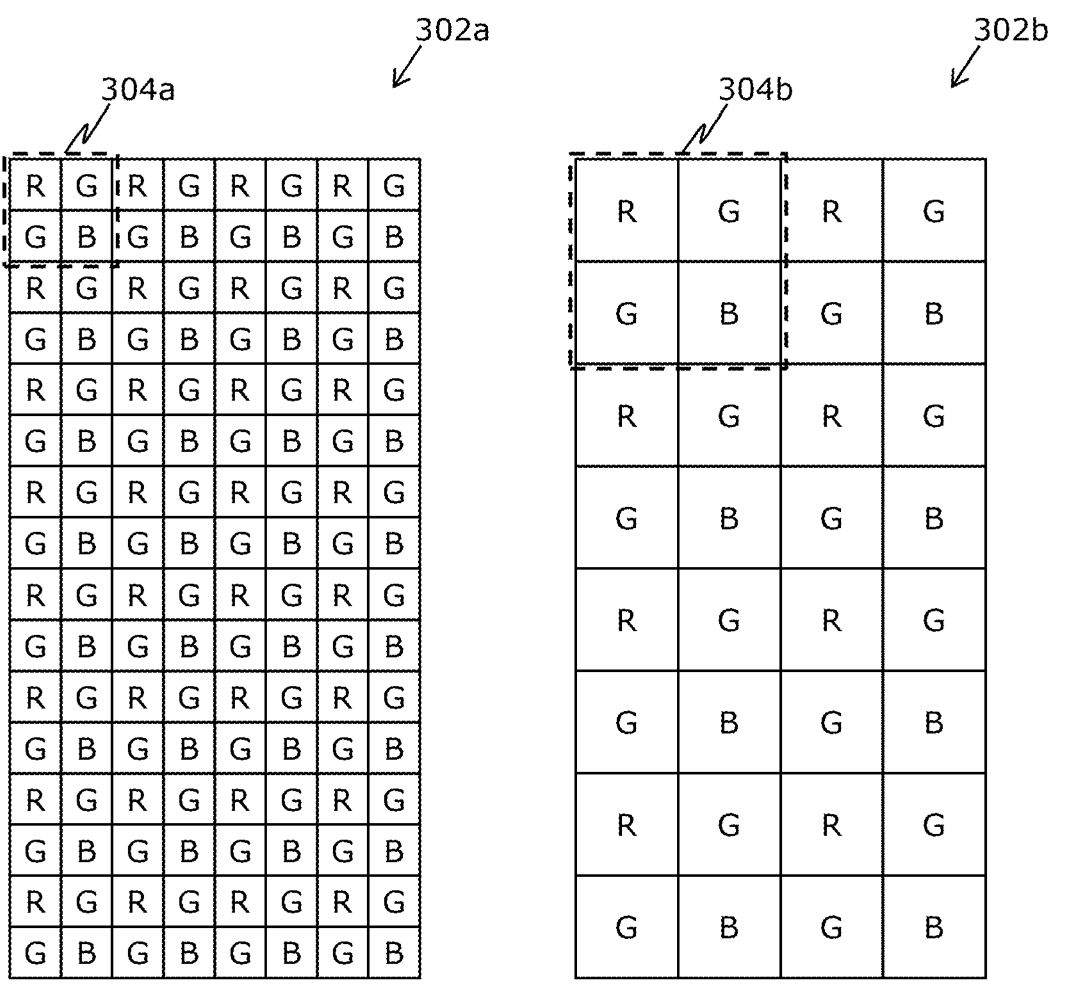
FIGS. 3A, 3B, 3C, and 3D illustrate various examples of images generated upon processing first image data and second image data, in accordance with an embodiment of the present disclosure.

With reference to FIG. 3A, a first-resolution image 302*a* is generated by processing the first image data, wherein the first-resolution image 302*a* has a pixel size that is equal to a first size of an individual one of the colour filters in any of the four sub-units 116*a-d*. As shown, a smallest repeating unit 304*a* of a colour pattern using which the first-resolution image 302*a* is generated, is different from the given physical smallest repeating unit 112. With reference to FIG. 3B, a second-resolution image 302*b* is generated by processing the second image data, wherein the second-resolution image 302*b* has a pixel size that is equal to a second size of an individual one of the four other colour filters 118*a-d*. As shown, a smallest repeating unit 304*b* of a colour pattern using which the first-resolution image 302*b* is generated, is different from the given physical smallest repeating unit 112. With reference to FIGS. 3A and 3B, a resolution of the first-resolution image 302*a* is greater than a resolution of the second-resolution image 302*b*.

Figures 3C, 3D, 4:
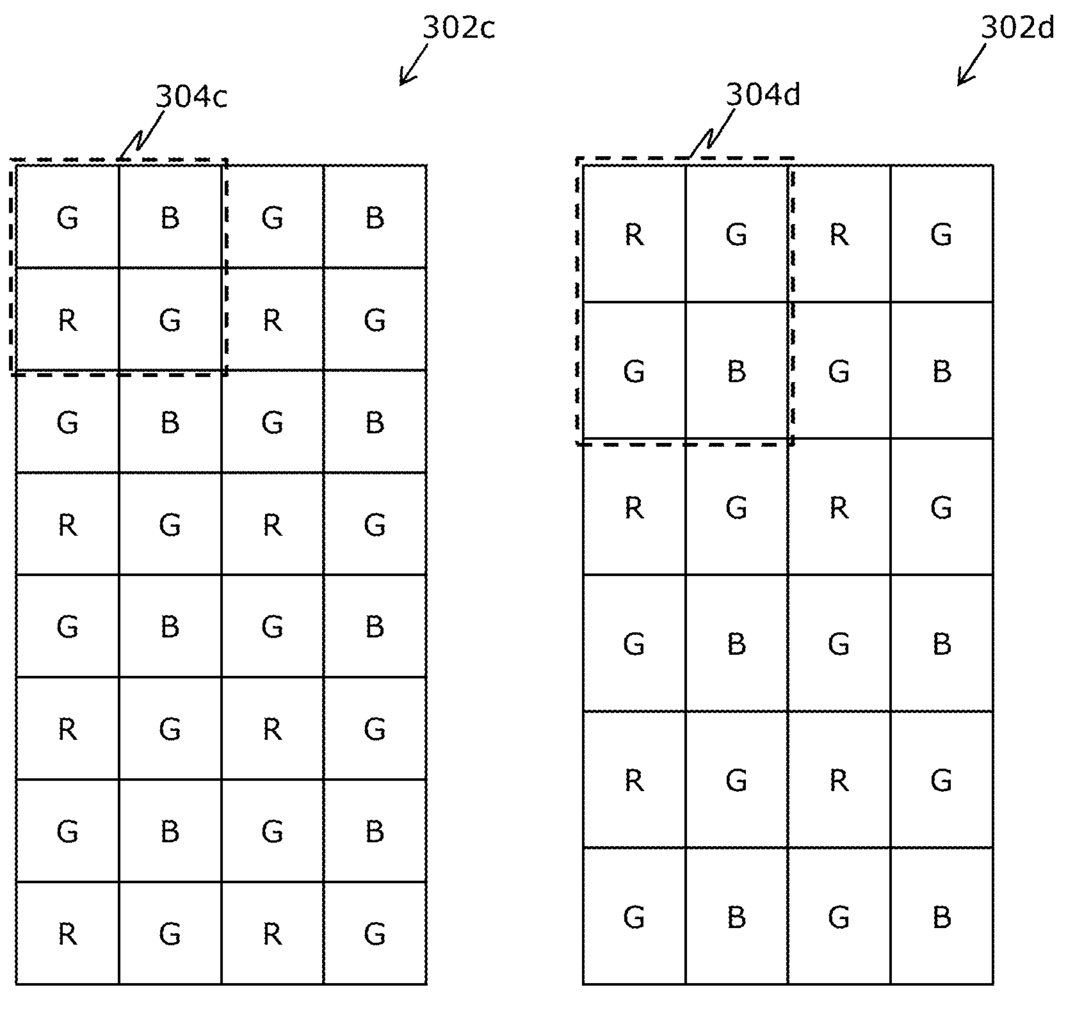
FIG. 4 illustrate steps of a method incorporating an interleaved colour filter array on an image sensor chip, in accordance with an embodiment of the present disclosure.

With reference to FIG. 3C, another second-resolution image 302*c* is generated by processing the second image data, wherein the another second-resolution image 302*c* has a pixel size that is equal to the second size. As shown, a smallest repeating unit 304*c* of a colour pattern using which the another third-resolution image 302*c* is generated, is different from the given physical smallest repeating unit 112, for example, in terms of a layout of colour filters in the smallest repeating unit 304*c*, such as from an RGGB layout to a GBRG layout).

With reference to FIG. 3D, a third-resolution image 302*d* is generated by processing the first image data and/or the second image data, wherein the third-resolution image 302*d* has a pixel size that is different from the first size and the second size. As shown, the pixel size of pixels in the third-resolution image 302*d* is greater than both the first size (i.e., a size of the individual one of the colour filters in any of the four sub-units 116*a-d*) and the second size (i.e., a size of the individual one of the four other colour filters 118*a-d*). Herein, a smallest repeating unit 304*d* of a colour pattern using which the third-resolution image 302*d* is generated, is different from the given physical smallest repeating unit 112. With reference to FIGS. 3A, 3B, and 3D, a resolution of the third-resolution image 302*d* is lesser than both the resolution of the first-resolution image 302*a* and the resolution of the second-resolution image 302*b*.

FIGS. 1B, 2A-2C, and 3A-3D are merely examples, which should not unduly limit the scope of the claims herein. The person skilled in the art will recognize many variations, alternatives, and modifications of embodiments of the present disclosure.

Referring to FIG. 4, illustrated are steps of a method incorporating an interleaved colour filter array on an image sensor chip, in accordance with an embodiment of the present disclosure. At step 402, first image data and second image data are obtained, wherein the first image data and the second image data are read out from an image sensor chip, wherein the image sensor chip comprises: a photo-sensitive surface comprising a plurality of photo-sensitive cells; and a colour filter array arranged on an optical path of the photo-sensitive surface, the colour filter array comprising a plurality of physical smallest repeating units, wherein a given physical smallest repeating unit comprises: at least four sub-units, a given sub-unit comprising colour filters of at least three different colours; and at least four other colour filters whose size is equal to a size of the given sub-unit, at least three of the at least four other colour filters having different colours, wherein the first image data is read out from photo-sensitive cells corresponding to the at least four sub-units in individual ones of the plurality of physical smallest repeating units, whilst the second image data is read out from photo-sensitive cells corresponding to the at least four other colour filters in the individual ones of the plurality of physical smallest repeating units. At step 404, at least one of: the first image data, the second image data is processed to generate at least one of: (i) a first-resolution image having a pixel size that is equal to a first size of an individual one of the colour filters in the given sub-unit, (ii) a second-resolution image having a pixel size that is equal to a second size of an individual one of the at least four other colour filters, (iii) a third-resolution image having a pixel size that is different from the first size and the second size, (iv) a high-dynamic range (HDR) image.

The aforementioned steps are only illustrative and other alternatives can also be provided where one or more steps are added, one or more steps are removed, or one or more steps are provided in a different sequence without departing from the scope of the claims.

The invention claimed is:

1. An imaging system comprising:

an image sensor chip comprising:

a photo-sensitive surface comprising a plurality of photo-sensitive cells; and a colour filter array arranged on an optical path of the photo-sensitive surface, the colour filter array comprising a plurality of physical smallest repeating units, wherein a given physical smallest repeating unit comprises:

at least four sub-units, a given sub-unit comprising colour filters of at least three different colours; and at least four other colour filters whose size is equal to a size of the given sub-unit, at least three of the at least four other colour filters having different colours;

at least one processor configured to:

obtain first image data read out from photo-sensitive cells corresponding to the at least four sub-units in individual ones of the plurality of physical smallest repeating units, whilst obtaining second image data read out from photo-sensitive cells corresponding to the at least four other colour filters in the individual ones of the plurality of physical smallest repeating units; and process at least one of: the first image data, the second image data to generate at least one of: (i) a first-resolution image having a pixel size that is equal to a first size of an individual one of the colour filters in the given sub-unit, (ii) a second-resolution image having a pixel size that is equal to a second size of an individual one of the at least four other colour filters, (iii) a third-resolution image having a pixel size that is different from the first size and the second size, (iv) a high-dynamic range (HDR) image.

2. The imaging system of claim 1, wherein in the given physical smallest repeating unit, the at least four sub-units are arranged in at least two first lines having two sub-units each, while the at least four other colour filters are arranged in at least two second lines having two other colour filters each, wherein a colour of at least one other colour filter in one of the at least two second lines is different from colours of other colour filters in another of the at least two second lines.

3. The imaging system of claim 2, wherein the at least two first lines alternate with the at least two second lines.

4. The imaging system of claim 1, wherein in the given physical smallest repeating unit, the at least four sub-units alternate with the at least four other colour filters in a horizontal direction as well as a vertical direction.

5. The imaging system of claim 1, wherein the colour filters of the given sub-unit are arranged in as an N×N array, wherein N is equal to 2 or 3.

6. The imaging system of claim 1, wherein when processing, the at least one processor is configured to perform at least one of:

interpolation and demosaicking on the first image data, to generate the first-resolution image;

interpolation and demosaicking on the second image data, to generate the second-resolution image;

interpolation and demosaicking on at least one of: the first image data, the second image data, to generate the third-resolution image.

7. The imaging system of claim 6, wherein the interpolation and the demosaicking on the first image data are performed, based on the second image data.

8. The imaging system of claim 6, wherein the interpolation and the demosaicking on the second image data are performed, based on the first image data.

9. The imaging system of claim 1, wherein when processing, the at least one processor is configured to perform interpolation and demosaicking on the first image data and the second image data, based on the first size of the individual one of the colour filters in the given sub-unit and the second size of the individual one of the at least four other colours filters, using an HDR imaging technique, to generate the HDR image.

10. The imaging system of claim 1, wherein the first image data and the second image data are read out using at least two different settings pertaining to at least one of: an exposure time, a sensitivity, an aperture size, wherein the first image data and the second image data are processed to generate the HDR image.

11. The imaging system of claim 1, wherein the first image data and the second image data are processed using at least one first neural network.

12. The imaging system of claim 1, wherein the image sensor chip further comprises a controller configured to employ at least one second neural network during read out of the first image data, wherein the first image data is in a RAW image format, and wherein a smallest repeating unit in a colour pattern of at least a part of the first image data is different from the given physical smallest repeating unit in the colour filter array of the image sensor chip.

13. The imaging system of claim 1, wherein the image sensor chip further comprises a controller configured to employ at least one second neural network during read out of the second image data, wherein the second image data is in a RAW image format, and wherein a smallest repeating unit in a colour pattern of at least a part of the second image data is different from the given physical smallest repeating unit in the colour filter array of the image sensor chip.

14. The imaging system of claim 1, wherein the first image data and the second image data are obtained as separate streams.

15. A method comprising:

obtaining first image data and second image data read out from an image sensor chip, wherein the image sensor chip comprises: a photo-sensitive surface comprising a plurality of photo-sensitive cells; and a colour filter array arranged on an optical path of the photo-sensitive surface, the colour filter array comprising a plurality of physical smallest repeating units, wherein a given physical smallest repeating unit comprises: at least four sub-units, a given sub-unit comprising colour filters of at least three different colours; and at least four other colour filters whose size is equal to a size of the given sub-unit, at least three of the at least four other colour filters having different colours, wherein the first image data is read out from photo-sensitive cells corresponding to the at least four sub-units in individual ones of the plurality of physical smallest repeating units, whilst the second image data is read out from photo-sensitive cells corresponding to the at least four other colour filters in the individual ones of the plurality of physical smallest repeating units; and processing at least one of: the first image data, the second image data to generate at least one of: (i) a first-resolution image having a pixel size that is equal to a first size of an individual one of the colour filters in the given sub-unit, (ii) a second-resolution image having a pixel size that is equal to a second size of an individual one of the at least four other colour filters, (iii) a third-resolution image having a pixel size that is different from the first size and the second size, (iv) a high-dynamic range (HDR) image.

* * * * *